April 17, 1973 A. M. GARBER 3,728,167

MASKING METHOD OF MAKING SEMICONDUCTOR DEVICE

Filed Nov. 16, 1970 5 Sheets-Sheet 1

INVENTOR
Alan M. Garber

By David M. Keay
Agent

INVENTOR
Alan M. Garber
By David M. Kearny
Agent

April 17, 1973 A. M. GARBER 3,728,167

MASKING METHOD OF MAKING SEMICONDUCTOR DEVICE

Filed Nov. 16, 1970 5 Sheets-Sheet 3

INVENTOR
Alan M. Garber

By David M. Kay
Agent

INVENTOR
Alan M. Garber

By David M Kay
Agent

April 17, 1973 A. M. GARBER 3,728,167

MASKING METHOD OF MAKING SEMICONDUCTOR DEVICE

Filed Nov. 16, 1970 5 Sheets-Sheet 5

INVENTOR

Alan M. Garber

By David M. Kay

Agent 3,728,167
Patented Apr. 17, 1973

3,728,167

MASKING METHOD OF MAKING SEMICONDUCTOR DEVICE

Alan M. Garber, Boxford, Mass., assignor to GTE Sylvania Incorporated

Filed Nov. 16, 1970, Ser. No. 89,905
Int. Cl. H01l 7/02
U.S. Cl. 148—187 3 Claims

ABSTRACT OF THE DISCLOSURE

An MIS device fabricated by forming the insulating structure of the gate of a thin layer of silicon oxide and an insulating material, such as silicon nitride, aluminum oxide, or aluminum silicate. The insulating structure masks the underlying channel during diffusion of the source and drain regions. Treatment in oxygen causes a thick field oxide to be grown at the silicon surface except under the insulating structure of the gate. Thus, a thin oxide is provided for the gate structure and a thick field oxide is provided for spacing the conductive metal paths away from the underlying silicon.

BACKGROUND OF THE INVENTION

This invention relates to semiconductor electrical translating devices. More particularly, it is concerned with MIS (metal-insulator-semiconductor) devices and methods of fabrication.

Semiconductor devices having an MIS structure are well known in the semiconductor industry. Typically these devices include a body of semiconductor material of one conductivity type, for example, N-type, having diffused therein two P-type regions designated the source and drain regions. The N-type region between the source and drain regions is designated the channel. The channel is covered with an insulating structure which may be silicon oxide or a combination of silicon oxide with other insulating materials. One insulating structure which has been found to provide particularly useful characteristics includes successive layers of silicon oxide and silicon nitride. The insulating structure is covered with a conducting material to complete the MIS gate structure. Conductive contacts are also provided to the source and drain regions.

Several hundred of these devices are fabricated at a time in a single wafer of silicon which may later be divided into individual integrated circuit networks. The devices are fabricated by employing known techniques of diffusing conductivity type imparting materials through openings in adherent coatings of silicon oxide. Silicon oxide remains on the silicon as a protective passivating layer and as insulating support for the pattern of deposited metal which provides electrical connections to the devices.

In order for MIS devices to have desirable operating characteristics, particularly speed of operation, capacitive effects within the device should be small. The insulating layers and the metal electrode of the gate structure should be accurately aligned with the underlying channel region in order to eliminate capacitive effects between overlapping metal and the source or the drain regions. It is also desirable that the protective passivating field oxide be thick in order to minimize capacitance between the conductive metal paths and the underlying silicon.

Various device configurations and fabrication procedures have been devised in attempting to obtain low capacitance effects and other desirable electrical characteristics. One specific device is the so-called silicon gate device. With this device a gate structure of silicon oxide, silicon nitride, and polycrystalline silicon is defined before the source and drain regions are diffused. The gate structure protects the underlying silicon from diffusion thus accurately aligning the gate structure with the channel region. The diffusion step also renders the polycrystalline silicon conductive, completing the MIS gate structure. A thick field oxide is then deposited to protect the device.

However, the fabrication of silicon gate devices requires additional processing steps. In addition, direct connections cannot be made between the conductive polycrystalline silicon of a gate and the source or drain region of another device. Connections must be made through openings in the field oxide to connect underlying polycrystalline silicon to the conductive metal pattern deposited on the field oxide. Furthermore, the polycrystalline silicon is limited as an interconnect conductor because of its relatively high resistivity and because it cannot cross over an underlying diffused area.

SUMMARY OF THE INVENTION

The method of producing MIS devices in accordance with the present invention provides improved devices having gate structures which are accurately aligned with respect to the source, drain, and channel regions, and also having thick field oxide which spaces the conductive leads of the source, drain, and gate away from the underlying silicon, thus reducing capacitance. The method employs a body of silicon having a region of one conductivity type, for example N-type. A layer of silicon oxide having an opening therein exposing a zone which defines the dimensions of the device is formed on a surface of the region. The insulating structure of the gate is formed on a portion of the zone so as to leave exposed two sectors of the zone which are separated by the insulating structure.

The insulating structure includes a layer of silicon oxide contiguous the surface of the body and a layer of an insulating material on the layer of silicon oxide. The insulating material is capable of masking the diffusion of conductivity type imparting materials and is also capable of masking the underlying silicon from oxidation. Conductivity type imparting material of the opposite conductivity type, for example P-type, is diffused into the two exposed sectors to form the source and drain regions.

The body is then treated to convert silicon adjacent the surface to silicon oxide. The silicon underlying the layer of insulating material is protected by the insulating material and is not converted to oxide. Silicon at the surface of the remainder of the region is converted to oxide thereby forming a thick layer of silicon oxide. Silicon oxide is removed from over portions of the sectors which constitute the source and drain regions in order to expose portions of the sectors. Conductive material is then applied to the surface of the layer of insulating material and to the exposed portions of the sectors to complete the gate structure and provide the source, drain, and gate electrical connections.

The resulting MIS device includes an insulating structure for the gate having a thin layer of silicon oxide contiguous the surface of a zone of one conductivity type, the channel region, intervening between the two sectors of the opposite conductivity type, the source and drain regions. The insulating structure also includes a layer of insulating material on the thin layer of silicon oxide. A thick layer of silicon oxide overlies the surface of the region other than the surface of the intervening zone covered by the insulating substrate. The conductive material of the gate overlies the layer of insulating material and extends in a conductive path over the thick layer of silicon oxide adjacent the insulating structure. Conductive members for the source and drain contact the sectors at openings in the thick silicon oxide and extend in conductive paths over the thick layer of silicon oxide.

BRIEF DESCRIPTION OF THE DRAWINGS

Additional objects, features, and advantages of the invention will be apparent from the following detailed discussion and the accompanying drawings wherein:

Although typically several hundred devices which may be interconnected to provide one or several integrated circuit networks are fabricated simultaneously in a single wafer of silicon, for purposes of illustration FIGS. 1–10 show only a single device being fabricated in a portion of a wafer.

Figure 1:
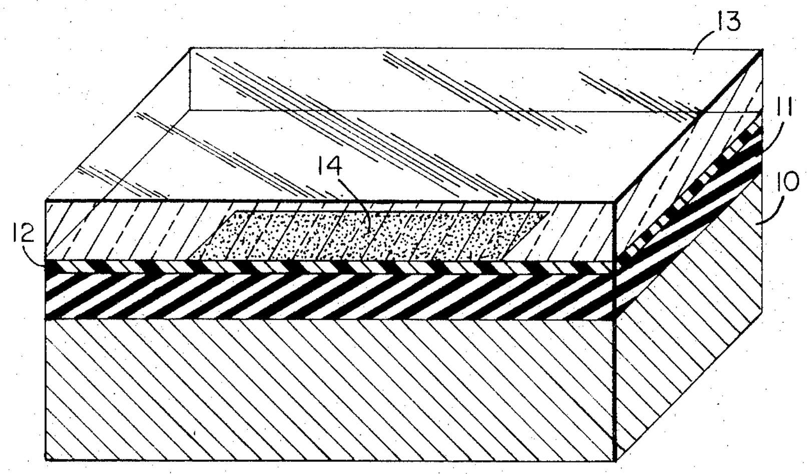
FIGS. 1–10 are perspective views in cross-section of a portion of a wafer of silicon illustrating various stages during the fabrication of an MIS device in accordance with the invention.

Because of the extremely small size of various portions of the elements illustrated in the drawings, some of the dimensions of many of the elements have been exaggerated with respect to other dimensions. It is believed that greater clarity of presentation is thereby obtained despite consequent distortion of elements in relation to their actual physical appearance.

DETAILED DESCRIPTION OF THE INVENTION

FIG. 1 illustrates a portion of a wafer of silicon 10 of one conductivity type, for example, N-type. The silicon may be doped with antimony to provide a resistivity of approximately 2 ohm-centimeters. An adherent layer of silicon oxide 11 is formed on the surface of the silicon wafer as by heating the wafer in the presence of wet oxygen. Although the thickness of the oxide layer is not critical, a thickness of from 6,000 to 8,000 angstrom units has been found satisfactory.

A layer 12 of a photosensitive resistant material of a type commonly employed in masking and etching techniques is placed over the surface of the oxide layer 11. Any of the well known photosensitive polymerizable resistant materials known in the art may be employed. The resistant material is applied as by spinning on, or by spraying.

The layer of resistant material 12 is dried and then selectively exposed to ultraviolet light through a mask 13. The mask is of a transparent material, typically glass, and portions 14 of one surface are rendered opaque in a particular pattern to delineate openings to be formed in the oxide. The mask is fabricated by employing known photolithographic techniques which enable the opaque areas and the transparent regions to be defined with a high degree of precision.

The mask 13 is properly positioned on the silicon wafer and the masked wafer is subjected to ultraviolet light polymerizing the portions of the resistant material underlying the transparent regions of the mask. Then the mask is removed, and the wafer is rinsed in a suitable developing solution which washes away the portions of the resistant material which were under the opaque regions of the mask and thus not exposed to ultraviolet light. The assembly may then be baked to further polymerize and harden the remaining resistant material.

Figure 2:
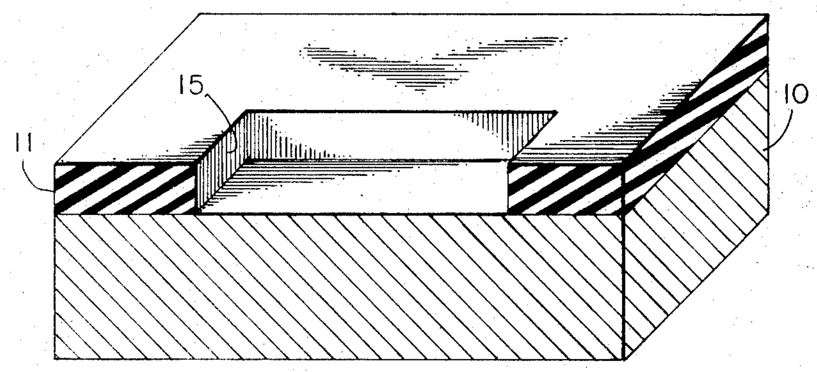

The wafer is immersed in a solution of buffered hydrofluoric acid, for a period of approximately 8 minutes for an oxide layer 11 of about 6,000 to 8,000 angstrom units thick, to dissolve away the exposesd silicon oxide and expose the underlying zone of the silicon wafer. The resistant material is then removed. The resulting wafer showing the opening 15 etched in the silicon oxide layer 11 is illustrated in FIG. 2.

Figure 3:
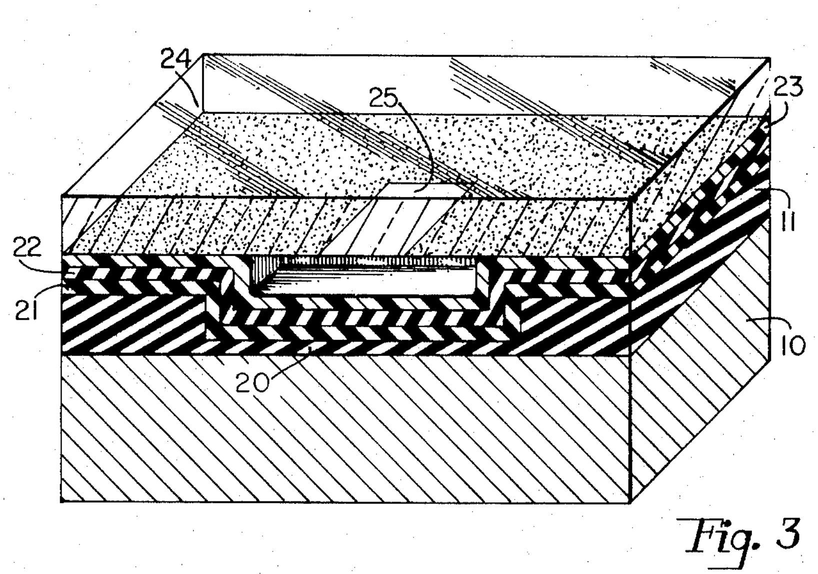

Next, the wafer is treated by exposing to wet oxygen at an elevated temperature to convert silicon at the surface to silicon oxide. A thin layer of silicon oxide 20 approximately 400 angstrom units thick is grown in the opening 15 (see FIG. 3).

An adherent layer of an insulating material 21 is then deposited over the silicon oxide. The insulating material 21 is a material which is capable of servnig as a mask during subsequent diffusion of conductivity type imparting materials into the silicon and which is also capable of preventing oxidation of the underlying silicon as will be explained in detail hereinbelow. Materials which are suitable for this purpose include silicon nitride, aluminum oxide, and aluminum silicate. These materials also provide desirable gate operating voltages in finished devices. Silicon nitride in particular has found wide acceptance in MIS devices. A layer of silicon nitride 21 approximately 400 angstrom units thick may be deposited onto the surface of the silicon oxide 11 and 20 as by sputtering or by the nitridation of silane using ammonia.

An adherent layer of silicon oxide 22 is deposited over the layer of silicon nitride 21. The silicon oxide layer 22 which is approximately 1000 angstrom units thick may be formed by the pyrolytic reaction of silane with oxygen or by decomposition of an organo-silicate.

A photosensitive resistant material 23 which may be of the same type as that previously employed is placed over the surface of the silicon oxide layer 22. A mask 24 which is opaque except for a transparent region 25 delineating the gate region of the device is placed over the wafer. The masked wafer is subjected to ultraviolet light polymerizing the photosensitive resistant material underlying the transparent region of the mask. The mask is removed and the assembly is rinsed in a developing solution to wash away the resistant material which was not exposed to light. The resulting wafer has adherent resistant material overlying the location of the gate.

The wafer is immersed in a solution of buffered hydrofluoric acid for a period of 1 minute to remove the portions of the silicon oxide layer 22 not protected by resistant material. This etching solution dissolves silicon oxide but does not attack silicon nitride. Following the etching treatment and rinsing of the assembly, the remaining resistant material is removed by dissolving in a suitable solvent.

Next, the wafer is immersed in a solution of orthophosphoric acid and water at a temperature of about 185° C. for a period of about 8 minutes. This solution dissolves silicon nitride but attacks silicon oxide at a much slower rate. Thus, the layer of silicon nitride is removed except for the portion protected by the overlying silicon oxide.

After the treatment in the orthophosphoric acid solution, the wafer is reimmersed in the buffered hydrofluoric acid etching solution for a period of 1 minute to dissolve away the remaining portion of the silicon oxide layer overlying the silicon nitride and to dissolve away the silicon oxide in the opening 15, except the portion protected by the silicon nitride. The resulting wafer with the silicon oxide 20 and silicon nitride 21 of the insulating structure of the gate remaining is illustrated in FIG. 4.

Figure 4:
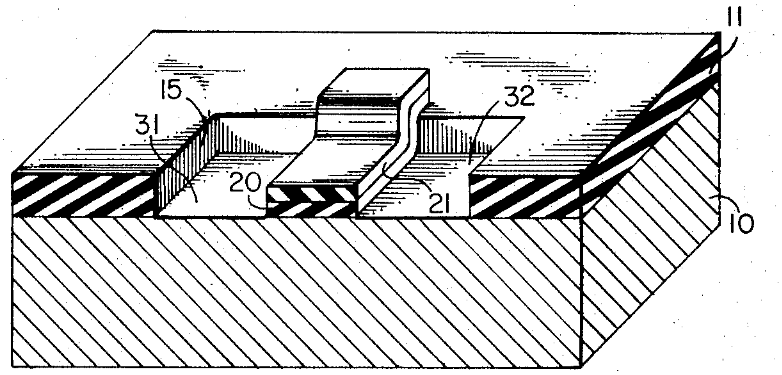
Figure 5:
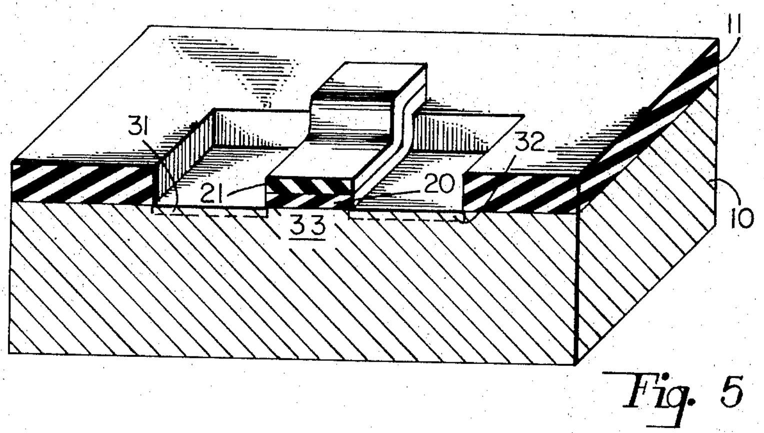

The wafer as illustrated in FIG. 4 is then treated by placing in a diffusion furnace to diffuse a P-type conductivity imparting material, for example, boron, into the two sectors 31 and 32 of the wafer which are exposed at the opening 15 in the oxide layer. Thus, two P-type regions 31 and 32 as illustrated in FIG. 5 are produced. These regions serve as the source and drain for the device. The N-type region 33 between the two P-type regions 31 and 32 is the channel region of the MIS device. The layers of silicon oxide 20 and silicon nitride 21 which serve to mask the channel region during diffusion and thus define the channel region in relation to the source and drain regions remain as the insulating structure of the gate.

Figure 6:
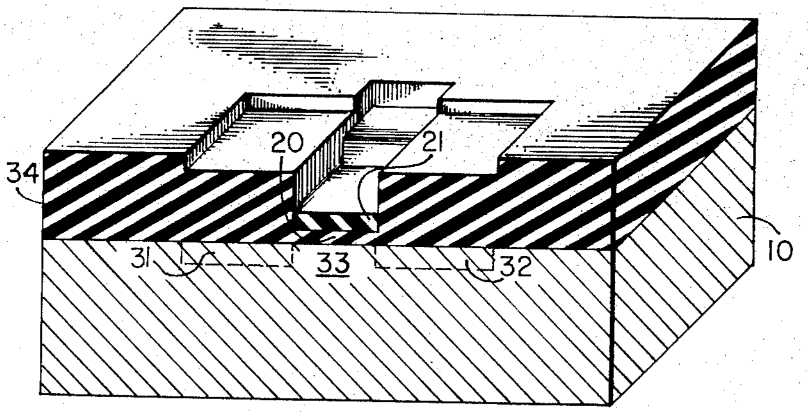

Next, the assembly is treated in a wet oxygen atmosphere at an elevated temperature to convert silicon at all of the surface of the wafer, except at the surface of the silicon underlying the silicon nitride of the gate structure, to silicon oxide. The silicon at the surface converts to silicon oxide in the presence of the oxygen which reaches the surface through the silicon oxide covering. However, the silicon nitride acts as a mask and prevents oxygen from reaching the surface of the silicon underlying the silicon nitride. Thus, as illustrated in FIG. 6 a thick layer of silicon oxide 34 approximately 2 microns thick is grown over the entire surface except for the portion under the silicon nitride of the gate structure. At the same time, the P-type conductivity imparting material diffuses farther enlarging the source and drain regions 31 and 32 as illustrated in FIG. 6.

The foregoing oxidation step provides an additional advantage over prior art processes in curing defects in the thin insulating structure. Pinholes are likely to occur in the photosensitive resist employed to define the insulating structure, and thus pinholes form through the insulating structure to the silicon surface during the etching steps. The oxidation step as described causes silicon oxide to form at any pinholes thus repairing the insulating structure.

Figure 7:
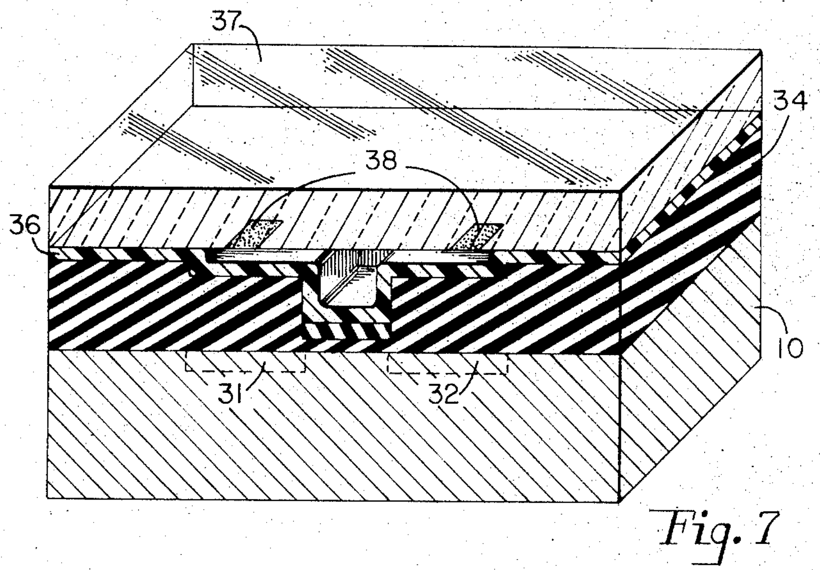
Figure 8:
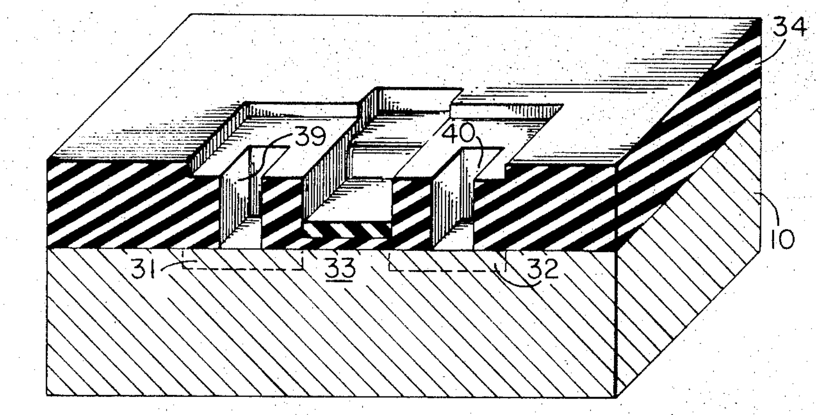

As illustrated in FIG. 7 the surface of the wafer is then coated with a layer of photosensitive resistant material 36. A mask 37 having opaque regions 38 defining contact openings to be formed in the silicon oxide layer 34 over the source and drain regions is placed on the wafer. The wafer is exposed to ultraviolet light, and then rinsed in a developing solution to remove the unexposed photoresist conforming to the opaque regions of the mask. The wafer is immersed in a buffered hydrofluoric acid solution for a period of about 20 minutes to etch openings 39 and 40, as shown in FIG. 8, in the thick oxide layer 34. The remaining resistant masking material is then removed.

Figure 9:
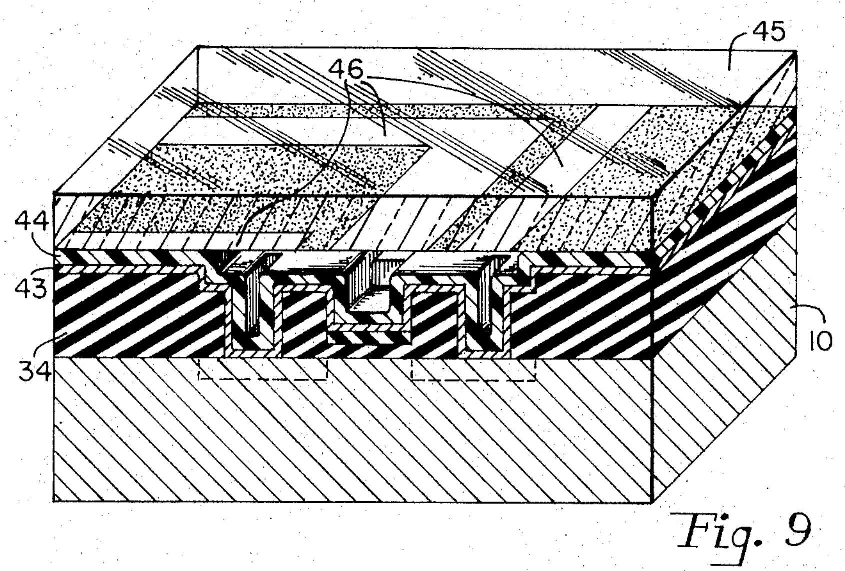

As illustrated in FIG. 9 the assembly is covered with a layer of aluminum 43 approximately 2 microns thick as by employing known vacuum deposition techniques. A layer of photosensitive resistant material 44 is applied over the aluminum. A mask 45 having transparent regions 46 delineating the pattern of aluminum conductive members to be left on the wafer is placed over the photosensitive resistant material. The masked wafer is exposed to ultraviolet light, and rinsed in a developing solution leaving resistant masking material only on those areas defined by the transparent regions 46 of the mask. The assembly is immersed in a heated phosphoric acid solution for about 5 minutes to remove the exposed aluminum. The resulting wafer is illustrated in FIG. 10.

Figure 10:
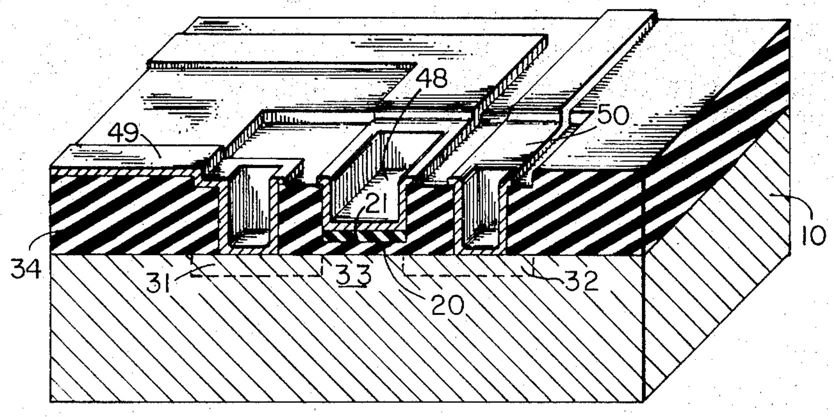

In the completed MIS device as shown in FIG. 10 the diffused P-type source and drain regions 31 and 32 are precisely located with respect to the insulating structure 20 and 21 of the gate by virtue of the insulating structure having been fabricated first and then employed to mask and thus define the channel region 33 between the source 31 and drain 32 during the diffusion step. That is, the electrically significant physical configurations of the source, drain, channel, and gate are all established by a single mask (mask 24 of FIG. 3) and not by two or more masks with consequent problems of alignment.

The metal electrode 48 of the gate overlies the insulating structure 20 and 21. The excess metal, which is unavoidable in order to insure that the entire insulating structure of the gate is covered by the metal electrode, overlaps the very thick oxide layer 34, and therefore has insignificant capacitive effect. The conductive path from the metal gate electrode overlies the thick silicon oxide layer from immediately adjacent the gate. The conductive paths from the source and drain contacts 49 and 50 also overlie the thick oxide layer 34 from immediately adjacent the contacts. Thus the conductive paths are spaced from the underlying silicon sufficiently so as to contribute very little capacitive effect to the device.

While there has been shown and described what is considered a preferred embodiment of the present invention, it will be obvious to those skilled in the art that various changes and modifications may be made therein without departing from the invention as defined by the appended claims.

What is claimed is:

1. The method of producing a semiconductor device includin the steps of providing a body of silicon having a region of one conductivity type;

forming on a surface of the region a layer of silicon oxide having an opening therein exposing a zone of the region including exposing the body of silicon to oxygen at an elevated temperature to grow a layer of silicon oxide at the surface of the body of silicon, and removing a portion of said layer of silicon oxide to provide an opening therein exposing said zone;

forming an insulating structure on a portion of said zone leaving exposed two sectors of the zone separated by the insulating structure, said insulating structure including a layer of silicon oxide contiguous the surface of said portion of the zone and a layer of insulating material on the layer of silicon oxide, said insulating material being capable of masking diffusion of conductivity type imparting materials and capable of masking the underlying silicon from oxidation, the step of forming an insulating structure including forming a thin layer of silicon oxide on said zone to cover the entire surface of the region with silicon oxide including exposing the body of silicon to oxygen at an elevated temperature to grow a thin layer of silicon oxide, depositing a layer of said insulating material on the silicon oxide, and removing portions of the insulating material and the silicon oxide to leave said layer of silicon oxide and said layer of insulating material on said portion of said zone and to expose said two sectors of the zone;

diffusing conductivity type imparting material of the opposite conductivity type into the two sectors;

treating the body of silicon to convert silicon adjacent said surface, except silicon underlying said layer of insulating material, to silicon oxide including exposing the body of silicon to oxygen at an elevated temperature to grow silicon oxide at said surface except at said portion of said zone underlying the layer of insulating material;

removing silicon oxide overlying portions of said sectors to expose portions of said sectors; and applying conductive material to said portions of said sectors and to the surface of the layer of insulating material of the insulating structure.

2. The method of producing a semiconductor device in accordance with the claim 1 wherein said insulating material is a material selected from the group consisting of silicon nitride, aluminum oxide, and aluminum silicate.

3. The method of producing a semiconductor device in accordance with the claim 2 wherein the thin layer of silicon oxide of the insulating structure is approximately 400 angstrom units thick;

the layer of insulating material is a layer of silicon nitride approximately 400 angstrom units thick; and the silicon oxide grown by treating the body to convert the silicon adjacent the surface, except silicon underlying the layer of insulating material, to silicon oxide is of the order of 2 microns thick.

References Cited

UNITED STATES PATENTS

| | | | |
|---|---|---|---|
| 3,475,234 | 10/1969 | Kerwin et al. | 148—187 |
| 3,455,020 | 7/1969 | Dawson et al. | 148—187 UX |
| 3,194,700 | 7/1965 | Grimmeiss et al. | 148—189 X |
| 3,585,089 | 6/1971 | Preece et al. | 148—187 |
| 3,597,667 | 8/1971 | Horn | 317—235.21 X |
| 3,108,915 | 10/1963 | Ligenza et al. | 148—187 |
| 3,484,313 | 12/1969 | Tauchi et al. | 148—187 |
| 3,516,914 | 6/1970 | Hall, Jr. | 148—187 X |
| 3,519,504 | 7/1970 | Cuomo | 148—187 |

OTHER REFERENCES

V. A. Dhaka et al., "Masking Technique" in IBM Technical Disclosure Bulletin, vol 11, No. 7, December 1968, pp. 864–865.

ALLEN B. CURTIS, Primary Examiner